United States Patent
McPherson et al.

(10) Patent No.: US 10,784,235 B2
(45) Date of Patent: Sep. 22, 2020

(54) SILICON CARBIDE POWER MODULE

(71) Applicant: Cree Fayetteville, Inc., Fayetteville, AR (US)

(72) Inventors: Brice McPherson, Fayetteville, AR (US); Sayan Seal, Fayetteville, AR (US); Zachary Cole, Summers, AR (US); Jennifer Stabach, Fayetteville, AR (US); Brandon Passmore, Fayetteville, AR (US); Ty McNutt, Farmington, AR (US); Alexander B. Lostetter, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 0 days.

(21) Appl. No.: 15/883,714

(22) Filed: Jan. 30, 2018

(65) Prior Publication Data

US 2019/0237439 A1 Aug. 1, 2019

(51) Int. Cl.
*H01L 25/065* (2006.01)
*H01L 25/07* (2006.01)
(Continued)

(52) U.S. Cl.
CPC .......... *H01L 25/072* (2013.01); *H01L 23/50* (2013.01); *H01L 23/5386* (2013.01); *H01L 24/48* (2013.01); *H01L 24/49* (2013.01); *H01L 25/18* (2013.01); *H01L 2224/0603* (2013.01); *H01L 2224/48227* (2013.01);
(Continued)

(58) Field of Classification Search
CPC ... H01L 25/072; H01L 23/50; H01L 23/5386; H01L 24/48; H01L 24/49; H01L 2224/48227; H01L 2224/49175; H01L 2924/10272; H01L 2924/1309; H01L 25/065

See application file for complete search history.

(56) References Cited

U.S. PATENT DOCUMENTS

| 3,598,942 A | 8/1971 | Laven |
| D630,198 S | 1/2011 | Wilkens et al. |
(Continued)

OTHER PUBLICATIONS

Evans et al., "Development of SiC Power Devices and Modules for Automotive Motor Drive Use", IEEE, 2013 International Meeting for Furure of Electron Devices, pp. 116-117. (Year: 2013).*

(Continued)

*Primary Examiner* — Gary L Laxton
(74) *Attorney, Agent, or Firm* — Withrow & Terranova, P.L.L.C.

(57) ABSTRACT

A power module includes a case, a first terminal, a second terminal, and a number of silicon carbide semiconductor die. The case has a footprint less than 30 cm$^2$. The silicon carbide semiconductor die are inside the case and coupled between the first terminal and the second terminal. The power module and the silicon carbide semiconductor die are configured such that in a first operating state the silicon carbide semiconductor die are capable of continuously blocking voltages greater than 650V between the first terminal and the second terminal, and in a second operating state the silicon carbide semiconductor die are capable of continuously passing currents greater than 200 A between the first terminal and the second terminal.

18 Claims, 9 Drawing Sheets

(51) Int. Cl.
*H01L 23/50* (2006.01)
*H01L 23/538* (2006.01)
*H01L 23/00* (2006.01)
*H01L 25/18* (2006.01)

(52) U.S. Cl.
CPC .......... *H01L 2224/4903* (2013.01); *H01L 2224/49111* (2013.01); *H01L 2224/49175* (2013.01); *H01L 2224/49431* (2013.01); *H01L 2224/49433* (2013.01); *H01L 2924/00014* (2013.01); *H01L 2924/10272* (2013.01); *H01L 2924/13091* (2013.01)

(56) References Cited

U.S. PATENT DOCUMENTS

| | | |
|---|---|---|
| D641,740 S | 7/2011 | Jeon et al. |
| 9,407,251 B1 | 8/2016 | Passmore et al. |
| 9,426,883 B2 | 8/2016 | McPherson et al. |
| 9,967,977 B1 | 5/2018 | McPherson |
| D829,174 S | 9/2018 | O'Brien |
| D837,152 S | 1/2019 | Wegerer et al. |
| D845,898 S | 4/2019 | Laffon de Mazieres et al. |
| D852,738 S | 7/2019 | Backett et al. |
| 10,347,549 B2 | 7/2019 | Spann |
| 10,375,841 B2 | 8/2019 | Kaneko |
| D865,666 S | 11/2019 | Roberts |
| D865,667 S | 11/2019 | Roberts |
| D866,463 S | 11/2019 | Hui |
| 10,524,385 B1 | 12/2019 | Lu |
| 2015/0216067 A1 | 7/2015 | McPherson et al. |
| 2017/0374755 A1* | 12/2017 | Chi ............. H05K 5/0247 |

OTHER PUBLICATIONS

Zhang et al., "Simulation-driven Development of a Novel SiC Embedded Power Module Design Concept", 2017 18th International Conference on Thermal, Mechanical and Multi-Physics Simulation and Experiments in Microelectronics and Microsystems, pp. 1-7. (Year: 2017).*

Microsemi Power Products Group, Datasheet for APTGT50A120T1G: Phase leg Fast Trench + Field Stop IGBT3 Power Module, Available online at: <<https://www.electronicsdatasheets.com/manufacturers/microsemi/parts/aptgt50a120t1g#datasheet>>, Oct. 2012, 6 pages.

Microsemi Power Products Group, Datasheet for APTGT150SK60T1G: Buck chopper Trench + Field Stop IGBT3 Power Module, Available online at: <<https://www.electronicsdatasheets.com/manufacturers/microsemi/parts/aptgt150sk60t1g#datasheet>>, Oct. 2012, 6 pages.

Zheng Z., et al., "Changes and challenges of photovoltaic inverter with silicon carbide device," Science Direct, Renewable and Sustainable Energy Reviews, vol. 78, Oct. 2017, Elsevier Ltd., pp. 624-639.

Restriction Requirement for U.S. Appl. No. 29/663,502, dated Feb. 3, 2020, 7 pages.

Quayle Action for U.S. Appl. No. 29/663,502, dated May 12, 2020, 6 pages.

* cited by examiner

SILICON CARBIDE POWER MODULE

FIELD OF THE DISCLOSURE

The present disclosure relates to power modules, and in particular to power modules including silicon carbide switching components configured to operate at high voltages and currents while maintaining high efficiency and a small footprint.

BACKGROUND

A power module is used to selectively deliver power to a load. The primary function of a power module is provided by a number of switching semiconductor devices (e.g., transistors and diodes) within the power module. When provided in a power system with one or more other power modules and/or one or more other components, the switching semiconductor components of a power module may form part of a power converter such as a half-bridge converter, a full-bridge converter, a buck converter, a boost converter, and the like. Power systems often deal with high voltages and currents, and thus the switching semiconductor devices of a power module must similarly be capable of reliably switching said high voltages and currents. In recent years, reduced power consumption has become a primary concern in power applications and thus it is desirable for a power module to provide low losses and thus high efficiency. As always, it is also desirable to do so at a low cost.

Conventionally, the switching semiconductor components of a power module have been silicon devices due to well-known processes for producing switching semiconductor components capable of reliably switching high voltages and currents. However, in recent years silicon carbide switching components for power modules have become popularized due to significant increases in switching speed and efficiency provided thereby. While power modules with silicon carbide switching components provide several performance benefits over their silicon counterparts, using silicon carbide switching components in a power module presents several challenges in the design thereof. Specifically, increased power density and concentrated electric fields in silicon carbide switching components may lead to thermal issues, which may in turn decrease reliability of the power module. Further, whereas a single, very large (in comparison to silicon carbide) silicon switching component may be used for each switch position in a conventional power module, several silicon carbide switching components are required for each switch position to achieve the same power handling capability. The use of several switching components requires additional signal routing and connections within the power module, all of which may add stray capacitance and/or inductance and thus may increase losses in the power module. In short, including silicon carbide switching components in a power module is not a matter of simply swapping them for a silicon switching component in an existing power module.

In light of the above, there is a present need for power modules including silicon carbide switching components that are capable of handling high voltages and currents while maintaining high efficiency, a small footprint, and low cost.

SUMMARY

In one embodiment, a power module includes a case, a first terminal, a second terminal, and a number of silicon carbide semiconductor die. The case has a footprint less than 30 cm$^2$. The silicon carbide semiconductor die are inside the case and coupled between the first terminal and the second terminal. The power module and the silicon carbide semiconductor die are configured such that in a first operating state the silicon carbide semiconductor die are capable of continuously blocking voltages greater than 650V between the first terminal and the second terminal, and in a second operating state the silicon carbide semiconductor die are capable of continuously passing currents greater than 200 A between the first terminal and the second terminal. Conventionally, power modules with footprints less than 30 cm$^2$ have not been capable of passing currents greater than 200 A. The features described throughout applicant's specification allow the power module to achieve these performance parameters in these small footprints.

In one embodiment, the power module and the silicon carbide semiconductor die are configured so that in the second operating state the silicon carbide semiconductor die are capable of continuously passing currents greater than 300 A and less than 400 A between the first terminal and the second terminal. The power module and the silicon carbide semiconductor die may further be configured so that in the first operating state the silicon carbide semiconductor die are capable of continuously blocking voltages up to 1700V between the first terminal and the second terminal.

In one embodiment, the case has a footprint less than 25 cm$^2$. A thermal resistance between a junction of at least one of the silicon carbide semiconductor die and the case may be less than 0.20° C./W. An electrical resistance between the first terminal and the second terminal may be less than 4.0 mΩ at 25° C. and less than 8.0 mΩ at 175° C.

In one embodiment, a power module includes a case, a power substrate, a first terminal, a second terminal, and a number of silicon carbide semiconductor die. The case has a footprint less than 30 cm$^2$. The power substrate is inside the case. The first terminal and the second terminal are blade connectors that are soldered to the power substrate. The silicon carbide semiconductor die are mounted on the power substrate and coupled between the first terminal and the second terminal. Using blade connectors for the first terminal and the second terminal that are soldered to the power substrate may significantly improve thermal and electrical characteristics of the connectors and therefore the power handling capability of the power module.

In one embodiment, each one of the first terminal and the second terminal includes a terminal base and a terminal body. The terminal base includes a first terminal base sub-section and a second terminal base sub-section separated from the first terminal base sub-section. The terminal body is rectangular and coupled to the terminal base such that the terminal body joins the first terminal base subsection and the second terminal base sub-section. Separating the terminal base into a first terminal base sub-section and a second terminal base sub-section may increase solder adhesion for each one of the first terminal and the second terminal and decrease stress between the terminals and the power substrate. Further, using the rectangular terminal body may significantly increase the current handling capability of the first terminal and the second terminal while decreasing the parasitic inductance associated therewith.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
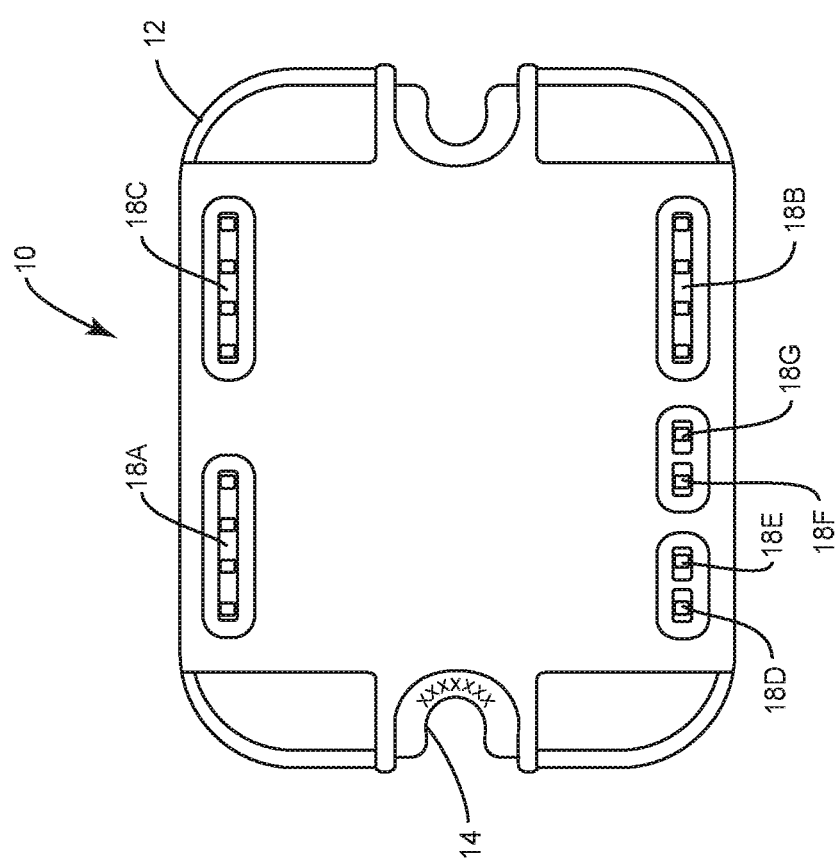
FIGS. 1A and 1B illustrate a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
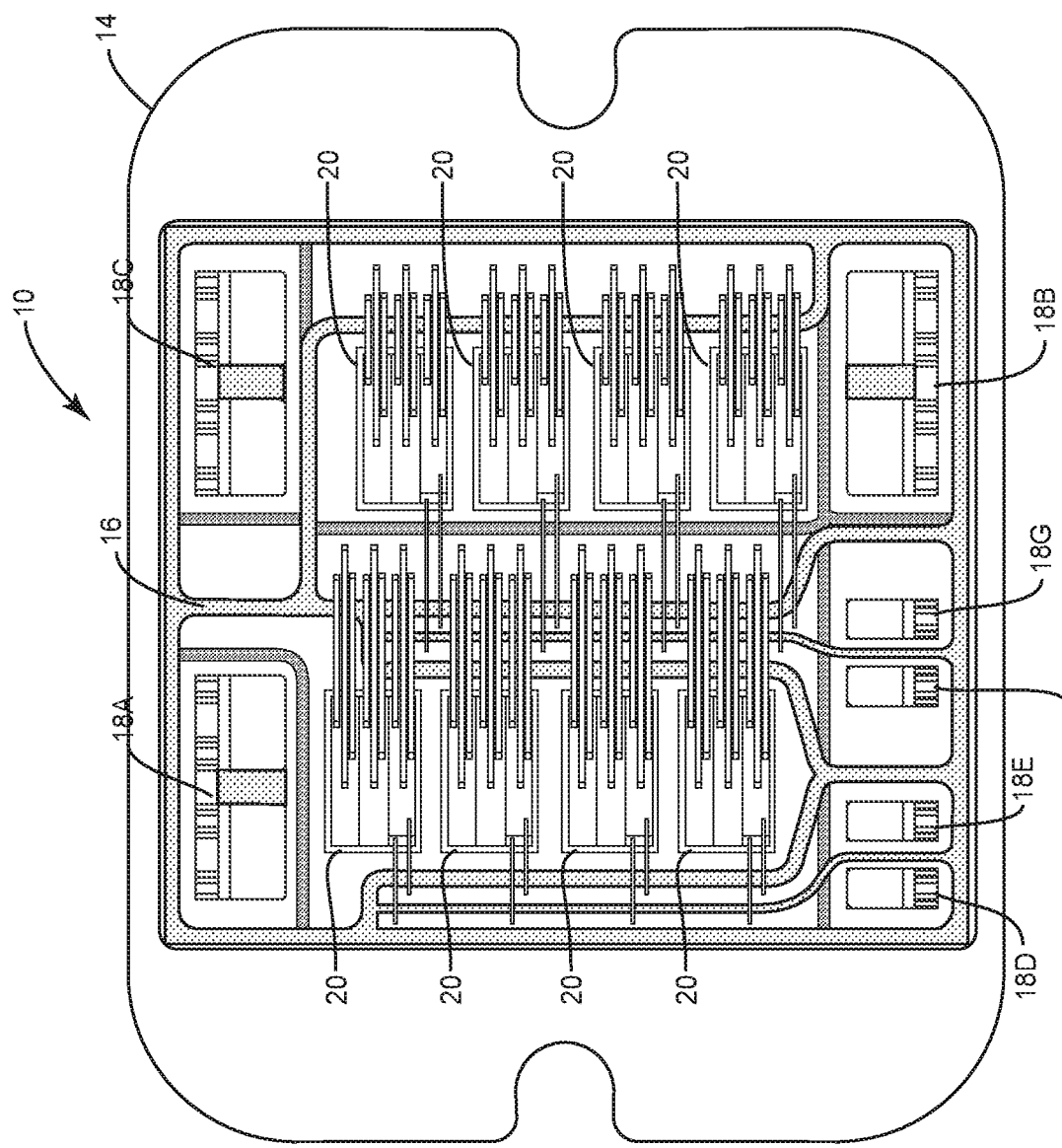
Figure 2:
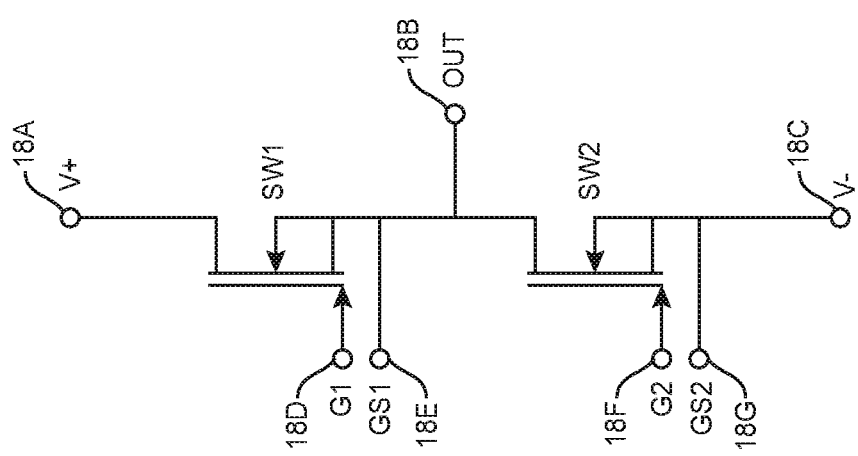
FIG. 2 is a functional schematic of a power module according to one embodiment of the present disclosure.

FIGS. 1A and 1B illustrate a power module 10 according to one embodiment of the present disclosure. The power module 10 includes a case 12, a baseplate 14, a power substrate 16, a number of terminals (referred to individually as 18A through 18G), and a number of silicon carbide semiconductor die 20. FIG. 2 shows a functional schematic of the power module 10. As shown, the number of silicon carbide semiconductor die 20 are arranged in a half bridge configuration between the terminals 18. A first one of the terminals 18A is a positive voltage terminal V+. A second one of the terminals 18B is an output terminal OUT. A third one of the terminals 18C is negative voltage terminal V−. A fourth one of the terminals 18D is a first gate terminal G1. A fifth one of the terminals 18E is a first gate sense terminal GS1. A sixth one of the terminals 18F is a second gate terminal G2. Finally, a seventh one of the terminals 18G is a second gate sense terminal GS2.

The power substrate 16 is on the baseplate 14 and in the case 12. Eight silicon carbide semiconductor die 20 are mounted on the power substrate 16. A first group of the silicon carbide semiconductor die 20 are coupled in parallel to form a first switch position SW1 of the power module 10, while a second group of the silicon carbide semiconductor die 20 are coupled in parallel to form a second switch position SW2 of the power module 10. The silicon carbide semiconductor die 20 are metal-oxide-semiconductor field-effect transistors (MOSFETs). Notably, while eight silicon carbide semiconductor die 20 are shown, any number of silicon carbide semiconductor die 20 may be used in the power module 10 without departing from the principles described herein.

In one embodiment, the baseplate 14 comprises pre-bowed copper. In another embodiment, the baseplate 14 comprises a metal matrix composite (MMC) material, which may extend the thermal cycling reliability of the power module 10. The power substrate 16 may be an active metal braze (AMB) substrate comprising a silicon nitride ($Si_3N_4$) or aluminum nitride (AlN) dielectric brazed between two copper layers and patterned to provide a desired electrical layout. The case 12 of the power module 10 may have a footprint less than 30 $cm^2$, less than 27.5 $cm^2$, less than 25 $cm^2$, less than 22.5 $cm^2$ and as low as 20 $cm^2$, or between 20 $cm^2$ and 30 $cm^2$, between 20 $cm^2$ and 27.5 $cm^2$, between 20 cm$^2$ and 25 cm$^2$, and between 20 cm$^2$ and 22.5 cm$^2$ in various embodiments. More specifically, the footprint of the case 12 may conform to industry standards for SP1 power modules, measuring 51.6 mm by 40.8 mm. Conventionally, the power handling capability of modules at this size has been significantly limited. For example, conventional power modules using silicon semiconductor components have been limited to continuous current conducting capabilities for each switch position in a half-bridge module less than 150 A. This may limit the applications available for such power modules, requiring customers to use larger power modules to achieve their desired power handling capabilities.

In operation, the first switch position SW1 and the second switch position SW2 are operated in a complementary fashion, where when the first switch position SW1 is conducting, the second switch position SW2 is blocking, and vice-versa. In the conducting state, the first switch position SW1 and the second switch position SW2 are capable of continuously passing currents greater than 200 A, greater than 225 A, greater than 250 A, greater than 275 A, greater than 300 A, greater than 325 A, greater than 350 A, and up to 400 A in various embodiments. In a blocking state, the first switch position SW1 and the second switch position SW2 are capable of continuously blocking voltages greater than 650V, greater than 750V, greater than 850V, greater than 950V, greater than 1050V, greater than 1150V, greater than 1250V, greater than 1350V, greater than 1450V, greater than 1550V, greater than 1650V, and up to 1700V. The significant improvements in power handling capability when compared to conventional power modules may be attributed to the silicon carbide semiconductor die 20 in addition to the various improvements to the design of the power module 10 discussed herein.

Figure 3A:
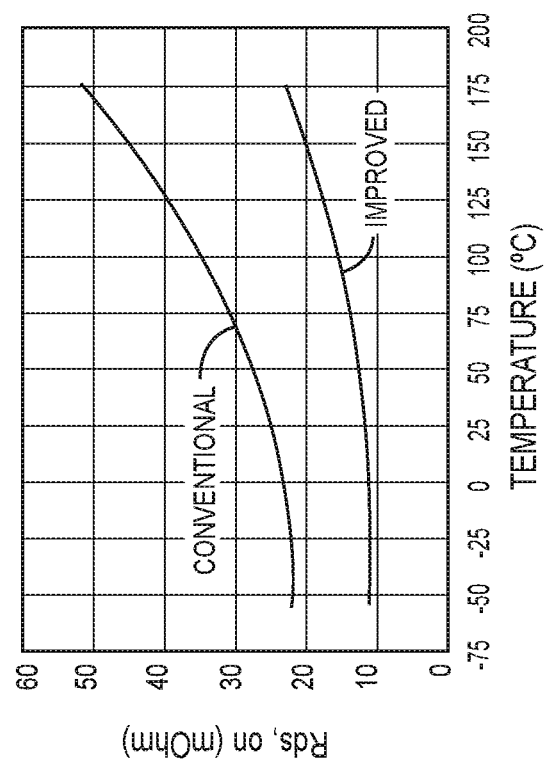
FIGS. 3A through 3D are graphs illustrating the performance of a power module according to one embodiment of the present disclosure.

With respect to the silicon carbide semiconductor die 20, each one may be, for example, a 1200V, 13 mΩ MOSFET with a 6Ω on-chip gate resistance (though the present disclosure is not so limited, any device having a similar size and pad layout may be used without departing from the principles described herein. An on-state resistance of each one of the silicon carbide semiconductor die 20 may have an improved dependence on temperature when compared to conventional devices such that each one of the silicon carbide semiconductor die 20 experiences only a 60-76% increase in on-state resistance from 25°–175° C. Specifically, an on-state resistance of each one of the silicon carbide semiconductor die 20 may be less than 20.0 mΩ, less than 17.5 mΩ, less than 15.0 mΩ, and as low as 13 mΩ at 25° C. in various embodiments and less than 30.0 mΩ, less than 27.5 mΩ, less than 25.0 mΩ, and as low as 23.0 mΩ at 175° C. in various embodiments. Since there are four silicon carbide semiconductor die 20 for each switch position in the exemplary power module 10 discussed herein, the on-state resistance of each one of the switch positions may be four times lower than the numbers presented above. These numbers may change if the switch positions include more or less semiconductor die 20 according to various embodiments. FIG. 3A is a graph illustrating a comparison of the relationship between on-state resistance and temperature for a conventional power transistor for a power module and one of the silicon carbide semiconductor die 20 used in the power module 10 described herein. As shown, the on-state resistance is not only less for the silicon carbide semiconductor die 20, but the variation in on-state resistance with respect to temperature is also significantly less than for a conventional power transistor. An input capacitance of each one of the silicon carbide semiconductor die 20 may be greater than 7000 pF, and specifically 7103 pF, to aid in preventing shoot-through. Accordingly, a threshold voltage $V_{TH}$ of each one of the silicon carbide semiconductor die 20 may be 2.5V such that a gate to source operating voltage $V_{GS,op}$ thereof may be +15/−4V. An output capacitance of each one of the silicon carbide semiconductor die 20 may be around 12 pF to improve switching. Rather than providing external diodes in the power module 10, the internal body diode of each one of the silicon carbide semiconductor die 20 may be used. A thermal resistance between a junction of at least one of the silicon carbide semiconductor die 20 and the case 12 may be less than 0.20° C./W, less than 0.15° C./W, and as low as 0.05° C./W. A loop inductance between the first one of the terminals 18A and the second one of the terminals 18B may be less than 25 nH in some embodiments, and as low as 5 nH.

Figures 3B, 3C:
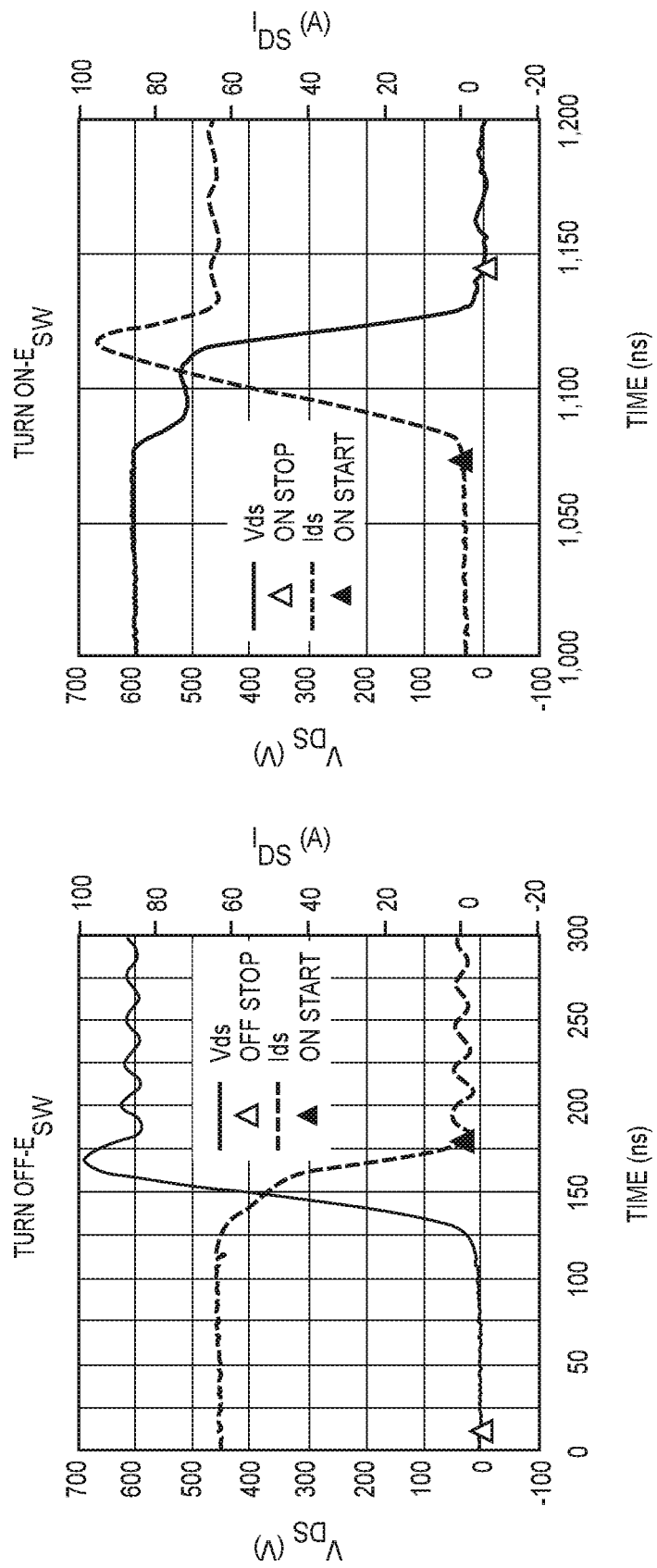
Figure 3D:
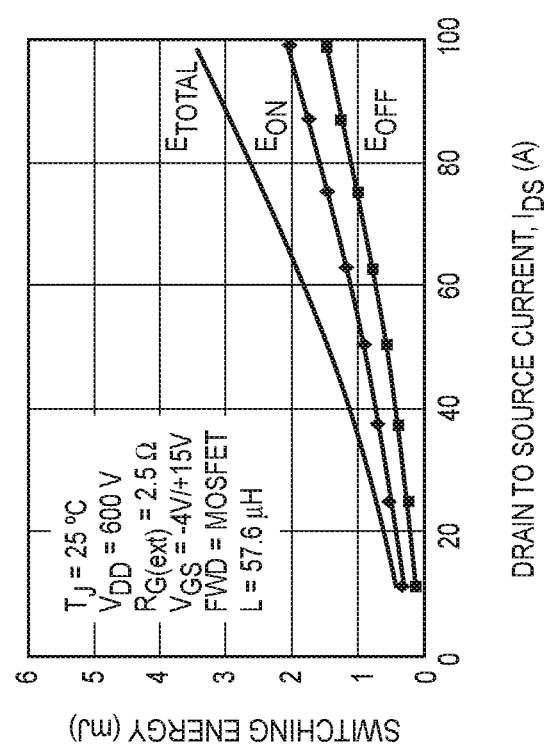

FIG. 3B is a graph illustrating the voltage and current for a single switch position of the power module 10 when that switch position is turning off. FIG. 3C is a graph illustrating the voltage and current for a single switch position of the power module 10 when that switch position is turning on. FIG. 3D is a graph illustrating a relationship between switching energy losses and current for a single switch position of the power module 10.

As discussed above, using silicon carbide semiconductor die 20 in the power module 10 requires a specialized design. One significant difference over conventional power modules is that each switch position of the power module 10 is implemented by a plurality of silicon carbide semiconductor die 20. Accordingly, the signal routing is significantly more complicated in the power module 10 in comparison to conventional power modules 10. To minimize inductance and thus losses and maximize the number of parallel silicon carbide semiconductor die 20 for each switch position in the power module 10, connections to the gate of each one of the silicon carbide semiconductor die 20 and their corresponding gate sense connections are run close to the wide power traces and along an entire edge thereof, thereby allowing for signal wire bonds to be formed at any location along the length thereof as illustrated in FIG. 1B. Between the switch positions, the silicon carbide semiconductor die 20 are slightly staggered and interleaved such that the power and signal current loops are reduced to the shortest and most direct possible path allowable in the footprint of the power module 10. The aforementioned layout also allows for a high level of configurability and modularity, as multiple device classes for the silicon carbide semiconductor die 20 can be used to achieve a specific voltage handling capability, current handling capability, on-state resistance, etc. The power module 10 can thus be optimized for high performance by including a higher number of silicon carbide semiconductor die 10 or for reduced cost by reducing the number of silicon carbide semiconductor die 20.

Figure 4A:
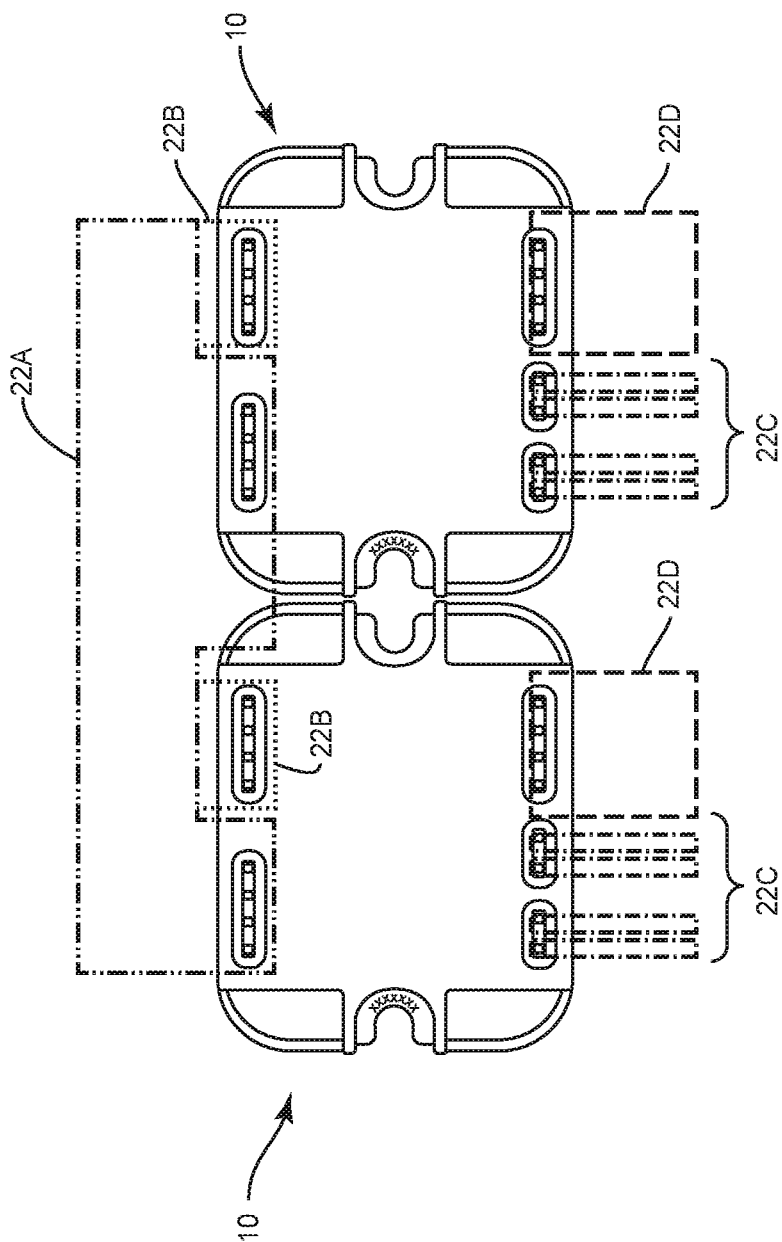
FIGS. 4A and 4B illustrate a power system comprising multiple power modules according to one embodiment of the present disclosure.
Figure 4B:
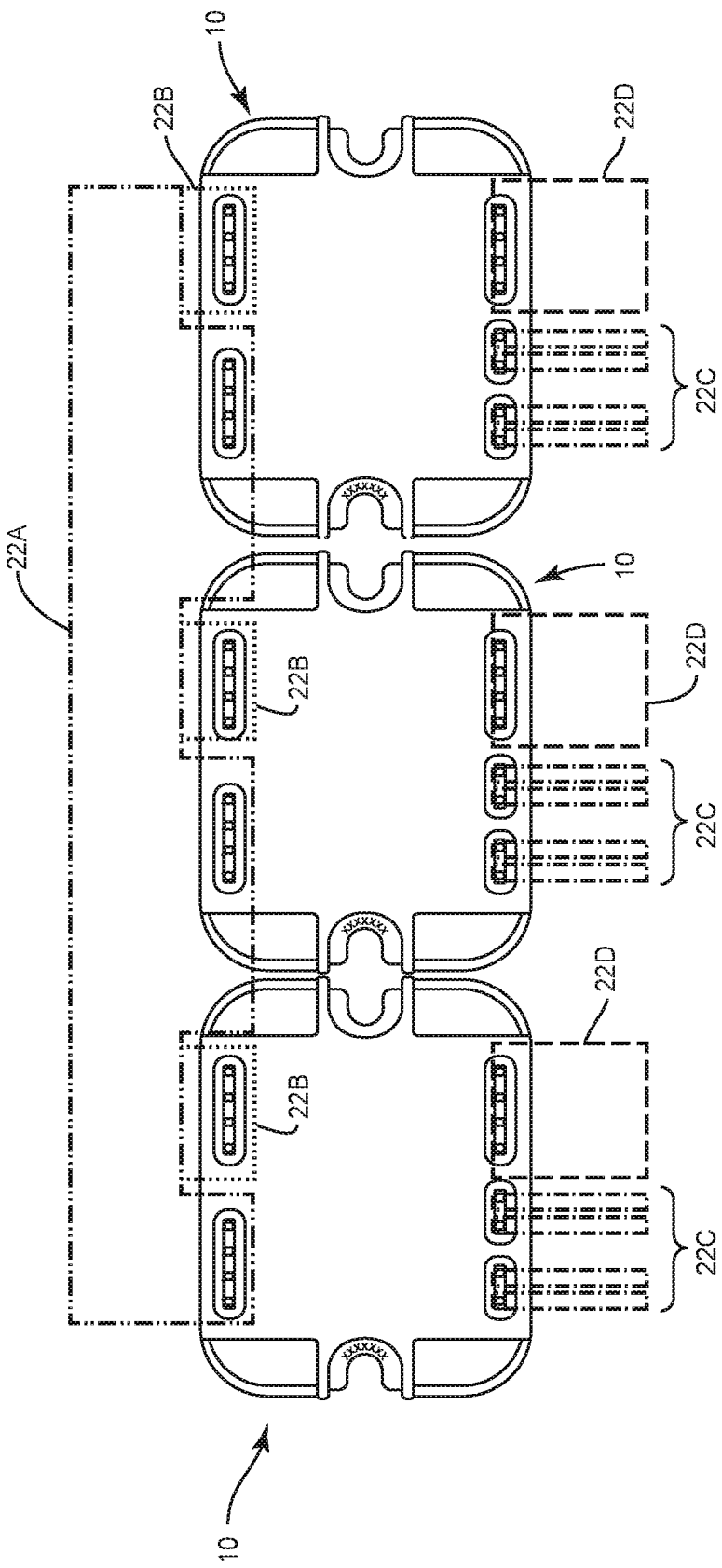

In addition to the above, the terminals 18 of the power module 10 are positioned to improve modularity of the power module 10. Specifically, the positive voltage terminal V+ and the negative voltage terminal V− are positioned adjacent to one another on the same side of the power module 10, which allows for multiple power modules 10 to be easily parallel to create different power converter arrangements such as full-bridge converters, three-phase converters, or multi-level topologies. FIG. 4A illustrates two power modules 10 coupled together by a number of printed circuit boards (PCBs) 22 (individually labeled as 22A through 22D) to form a full-bridge converter. FIG. 4B illustrates three power modules 10 coupled together by a number of PCBs 22 (individually labeled as 22A through 22D) to form a three-phase motor drive. While shown separately to illustrate the concept, the PCBs 22 may actually be a single PCB implemented using multiple layers.

Figure 5:
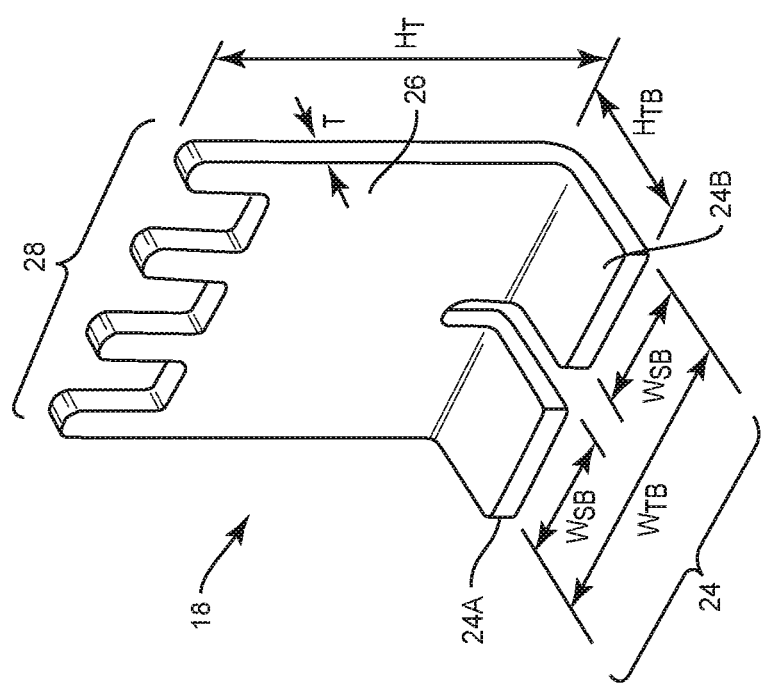
FIG. 5 illustrates a blade connector for a power module according to one embodiment of the present disclosure.

In addition to the above, the terminals 18 themselves contribute to the high power handling capability of the power module 10. FIG. 5 illustrates details of one of the terminals 18 according to one embodiment of the present disclosure. The terminal 18 includes a terminal base 24, a terminal body 26, and a terminal header 28. The terminal base 24 is divided into a first terminal sub-base 24A and a second terminal sub-base 24B, which are separated from one another by a gap. The terminal body 26 is rectangular and coupled to the terminal base 24 such that the terminal body 26 connects the first terminal sub-base 24A and the second terminal sub-base 24B. Notably, the terminal body 26 is quite wide, such that a width $W_{TB}$ thereof is greater than 5 mm, greater than 6 mm, greater than 7 mm, greater than 8 mm, greater than 9 mm, greater than 10 mm, and up to 15 mm, or between 5 mm and 15 mm, between 6 mm and 15 mm, between 7 mm and 15 mm, between 8 mm and 15 mm, between 9 mm and 15 mm, and between 10 mm and 15 mm in various embodiments. Accordingly, each one of the first terminal sub-base 24A and the second terminal sub-base 24B may have a width $W_{SB}$ greater than 2 mm, greater than 3 mm, greater than 4 mm, greater than 5 mm, and up to 6 mm in various embodiments. A height of the terminal base 24 $H_{TB}$ may be greater than 1 mm, greater than 2 mm, greater than 3 mm, greater than 4 mm, and up to 10 mm, or between 1 mm and 10 mm, between 2 mm and 10 mm, between 3 mm and 10 mm, between 4 mm and 10 mm, and between 5 mm and 10 mm. Accordingly, a surface area of each one of the first terminal sub-base 24A and the second terminal sub-base 24B available for contact with the power substrate 16 may be between 5 $mm^2$ and 150 $mm^2$, or any number of sub-ranges thereof based upon the aforementioned heights and widths. In one embodiment, the total area of the terminal base 24 available for contact with the power substrate 16 is at least 15 $mm^2$ and less than 50 $mm^2$. The gap between the first terminal sub-base 24A and the second terminal sub-base 24B may be between 0.5 mm and 2.0 mm in various embodiments. Both the terminal base 24 and the terminal body 26 may have a thickness T greater than 0.5 mm and up to 2.0 mm in various embodiments. The terminal header 28 may be coupled to the terminal body 26 and break the terminal body 26 into a number of pins, which may be soldered to a PCB in a through-hole fashion. A total height $H_T$ of the terminal 18 may be greater than 12 mm and up to 16 mm in various embodiments. Breaking the terminal base 24 into the first terminal sub-base 24A and the second terminal sub-base 24B with a gap may increase the adherence of the terminal 18 to the power substrate 16 due to the fact that a larger edge area is exposed thus allowing the solder to better adhere thereto. Further, the break in the terminal base 24 may reduce mechanical stress between the power substrate 16 and the terminal 18. The large width of the terminal 18 provides significant improvements in the conduction thereof and thus the current handling capability thereof. This may contribute to the significantly increased current handling capability of the power module 10 when compared to conventional power modules of this footprint, which generally use individual pins to connect to the power substrate. Finally, the design of the terminal 18 may reduce parasitic inductance typically associated with pin-based terminals, which may reduce losses in the power module 10. In one embodiment, the terminal 18 is copper, however, any suitable conductor may be used for the terminal without departing from the principles described herein.

Those skilled in the art will recognize improvements and modifications to the preferred embodiments of the present disclosure. All such improvements and modifications are considered within the scope of the concepts disclosed herein and the claims that follow.

What is claimed is:

1. A power module comprising:
   a case having a footprint less than 30 $cm^2$;
   a first terminal and a second terminal, each terminal comprising:
   a terminal base connected to a power substrate, the terminal base comprising a first terminal base sub-section and a second terminal base sub-section, wherein an area of the first terminal base sub-section and the second terminal base sub-section in contact with the power substrate is greater than 15 $mm^2$;
   a terminal body coupled to the terminal base; and
   a plurality of silicon carbide semiconductor die inside the case on the power substrate and coupled between the first terminal and the second terminal, wherein the power module and the plurality of silicon carbide semiconductor die are configured so that:
   in a first operating state, the plurality of silicon carbide semiconductor die is capable of continuously blocking voltages greater than 650V and up to 1700V between the first terminal and the second terminal; and
   in a second operating state, the plurality of silicon carbide semiconductor die is capable of continuously passing currents greater than 200 A between the first terminal and the second terminal.

2. The power module of claim 1 wherein the power module and the plurality of silicon carbide semiconductor die are configured so that in the second operating state the plurality of silicon carbide semiconductor die are capable of continuously passing currents greater than 300 A and up to 400 A between the first terminal and the second terminal.

3. The power module of claim 2 wherein the footprint of the case is less than 25 $cm^2$ and as low as 20 $cm^2$.

4. The power module of claim 2 wherein the power module and the plurality of silicon carbide semiconductor die are configured so that in the first operating state the plurality of silicon carbide semiconductor die is capable of continuously blocking voltages up to 1700V between the first terminal and the second terminal.

5. The power module of claim 2 wherein a thermal resistance between a junction of at least one of the plurality of silicon carbide semiconductor die and the case is less than 0.20° C./W and as low as 0.05° C./W.

6. The power module of claim 1 wherein the footprint of the case is less than 25 $cm^2$ and as low as 20 $cm^2$.

7. The power module of claim 1 wherein the power module and the plurality of silicon carbide semiconductor die are configured so that in the second operating state a resistance between the first terminal and the second terminal is less than 4.0 mΩ at 25° C. and as low as 3.0 mΩ at 25° C.

8. The power module of claim 7 wherein the power module and the plurality of silicon carbide semiconductor die are configured so that in the second operating state the resistance between the first terminal and the second terminal is less than 8.0 mΩ at 175° C. and as low as 5.0 mΩ at 175° C.

9. The power module of claim 1 wherein a thermal resistance between a junction of at least one of the plurality of silicon carbide semiconductor die and the case is less than 0.20° C./W and as low as 0.05° C./W.

10. The power module of claim 1 wherein a loop inductance between the first terminal and the second terminal is less than 25 nH and as low as 5 nH.

11. The power module of claim 1 wherein the area of each one of the first terminal and the second terminal in contact with the power substrate is less than 50 mm$^2$.

12. A power module comprising:
a case having a footprint less than 30 cm$^2$;
a power substrate inside the case;
a first terminal and a second terminal, each of which is a blade connector soldered to the power substrate comprising:
  a terminal base soldered to the power substrate, the terminal base comprising a first terminal base sub-section and a second terminal base sub-section separated from the first terminal base sub-section; and
  a terminal body coupled to the terminal base such that the terminal body is coupled with each of the first terminal base sub-section and the second terminal base sub-section; and
a plurality of silicon carbide semiconductor die mounted on the power substrate and coupled between the first terminal and the second terminal such that the first terminal is configured to provide a positive supply voltage to the plurality of silicon carbide semiconductor die and the second terminal is configured to provide a negative supply voltage to the plurality of silicon carbide semiconductor die, wherein the first terminal and the second terminal are arranged to be adjacent to one another on the power substrate.

13. The power module of claim 12 wherein the first terminal and the second terminal each further comprise a terminal header coupled to the terminal body, the terminal header comprising a plurality of pins configured to be soldered to a printed circuit board.

14. The power module of claim 12 wherein a width of the terminal body is greater than 5 mm and less than 15 mm.

15. The power module of claim 12 wherein a loop inductance between the first terminal and the second terminal is less than 25 nH and as low as 5 nH.

16. The power module of claim 12 wherein an area of each one of the first terminal and the second terminal in contact with the power substrate is greater than 15 mm$^2$ and less than 50 mm$^2$.

17. The power module of claim 12 wherein a width of each one of the first terminal and the second terminal is greater than 5 mm and less than 15 mm.

18. The power module of claim 12 wherein the footprint of the power module is as low as 20 cm$^2$.

* * * * *